(12) United States Patent
Lin et al.

(10) Patent No.: US 9,029,190 B2
(45) Date of Patent: May 12, 2015

(54) METHOD FOR MANUFACTURING GRAPHENE FILM AND GRAPHENE CHANNEL OF TRANSISTOR

(71) Applicant: Academia Sinica, Taipei (TW)

(72) Inventors: Shih-Yen Lin, Taipei (TW); Meng-Yu Lin, Taipei (TW)

(73) Assignee: Academia Sinica, Taipei (TW)

( * ) Notice: Subject to any disclaimer, the term of this patent is extended or adjusted under 35 U.S.C. 154(b) by 0 days.

(21) Appl. No.: 14/028,760

(22) Filed: Sep. 17, 2013

(65) Prior Publication Data

US 2014/0273414 A1    Sep. 18, 2014

(30) Foreign Application Priority Data

Mar. 13, 2013    (TW) .............................. 102108797 A (51) Int. Cl.
| | | |
|---|---|---|
| *H01L 21/00* | (2006.01) | |
| *H01L 21/02* | (2006.01) | |
| *H01L 29/66* | (2006.01) | |
| *H01L 29/778* | (2006.01) | |
| *H01L 29/16* | (2006.01) | |

(52) U.S. Cl.
CPC .... *H01L 21/02527* (2013.01); *H01L 21/02631* (2013.01); *H01L 21/02425* (2013.01); *H01L 21/02664* (2013.01); *H01L 29/66045* (2013.01); *H01L 29/7781* (2013.01); *H01L 29/1606* (2013.01)

(58) Field of Classification Search
None
See application file for complete search history.

(56) References Cited

U.S. PATENT DOCUMENTS

| | | | | |
|---|---|---|---|---|
| 4,764,026 | A * | 8/1988 | Powell et al. ................. | 374/178 |
| 8,632,633 | B2 * | 1/2014 | Barker et al. .................. | 117/87 |
| 8,685,843 | B2 * | 4/2014 | Li et al. ......................... | 438/479 |
| 2002/0076911 | A1 * | 6/2002 | Lin ................................ | 438/613 |
| 2011/0089404 | A1 * | 4/2011 | Marcus et al. ................. | 257/29 |
| 2013/0174968 | A1 * | 7/2013 | Vlassiouk et al. ............. | 156/155 |
| 2013/0217222 | A1 * | 8/2013 | Johnson et al. ............... | 438/610 |
| 2013/0230722 | A1 * | 9/2013 | Fujii et al. ..................... | 428/408 |
| 2014/0162021 | A1 * | 6/2014 | Fujii et al. ..................... | 428/141 |
| 2014/0183160 | A1 * | 7/2014 | Chiba et al. ................... | 216/36 |

OTHER PUBLICATIONS

"Low-temperature grown graphene films by using molecular beam epitaxy" by Meng-Yu Lin et al.; publication date Aug. 10, 2012 when received; Appl. Phys. Lett. 101, 221911 (2012).*
"Graphene segregated on Ni surfaces and transferred to insulators" By Q. K. Yu et al.; Purdue University; 2008.*

* cited by examiner

*Primary Examiner* — Charles Garber
*Assistant Examiner* — Evren Seven
(74) *Attorney, Agent, or Firm* — Birch Stewart Kolasch & Birch, LLP (57) ABSTRACT

The present invention provides a method for manufacturing a graphene film and a graphene channel of transistor. The graphene film is prepared at a low temperature by using molecular beam epitaxy technique, and the graphene channel is able to fit into a transistor. The excellent characteristic of current modulation within graphene transistors is observed.

19 Claims, 5 Drawing Sheets

METHOD FOR MANUFACTURING GRAPHENE FILM AND GRAPHENE CHANNEL OF TRANSISTOR

BACKGROUND OF THE INVENTION

1. Field of the Invention

The present invention relates to a method for manufacturing a graphene film and a graphene channel of transistor. More particularly, it relates to a method for manufacturing a graphene film and a graphene channel of transistor under low temperature.

2. Description of Related Art

Graphene is famous for the most fantastic material in this century, in which is formed by carbon atoms in a single layer. In this material, carbon atoms are densely arranged in a regular hexagonal pattern by $sp^2$ hybrid orbital, and the lattice arrangement in honeycombs shape extends to form a planar two-dimensional material. Furthermore, graphene is a one-atom-thick planar sheet, and it is the thinnest and strongest nanomaterial in the world.

Many different approaches have been developed for manufacturing graphene, such as mechanical exfoliation, SiC sublimation, and chemical vapor deposition (CVD). For the mechanical exfoliation method, only flakes of graphene are obtained. For the SiC sublimation method, the high price of the SiC substrates is the major concern for practical applications. Accordingly, those applications in the industry are limited a lot.

Therefore, the CVD technique has become a common approach to obtain graphene films. This method has exhibited advantages like large-area graphene growth and controllable layer numbers. In CVD method, Ni and Cu are two metals commonly used as the substrates. Different from the growth mechanisms comprising C atom dissolution and precipitation by using a Ni template, the low solubility of C atoms in Cu foil results in different graphene growth mechanisms, comprising surface migration and self-align arranged construction of C atoms on the Cu foil. Therefore, uniform single-layer graphene films can be obtained by using Cu substrates. The required graphene growth temperature depends on the temperature needed for cracking the hydrocarbon source to supply the C atoms. By using the common precursor methane, the growth temperature is usually around 1000° C. To decrease the growth temperature, different approaches have been investigated by using different precursors. By using other gases, such as hexane, methanol or ethanol, graphene films can be obtained at a decreased growth temperature ranged from 950 to 650° C. The lowest growth temperature reported in literatures is 300° C. by using benzene as the carbon source in a low-pressure CVD chamber. However, in that report, only graphene flakes are obtained. On the other hand, the growth temperature for Ni substrate is usually kept at 900-1000° C. due to the required carbon dissolution procedure.

For the conventional technologies, the graphene film transferring and reattachment procedures are required for both Ni and Cu substrates after growth. In this case, it seems that the high-temperature growth procedure may not influence the following device fabrication. However, the graphene transferring procedure does not fit in the standard fabrication procedures for semiconductor devices, which limits the potential applications of this material. In order to solve the problem of graphene transferring procedure, references have reported direct growth of graphene on a silicon dioxide substrate by evaporating copper on the silicon dioxide substrate and using methane as a carbon source, and this mechanism is the same as the mechanism of CVD method. Carbon atoms aggregate to form a graphene film between the metal and silicon dioxide substrate after annealing at a high temperature. These growth mechanisms are mainly identical with the CVD method, so the process keeps at a high temperature. On the basis of the above-mentioned references, direct growth of graphene at a lower temperature would be the important first step to integrate graphene growth into semiconductor fabrication lines. Thus, the present invention provides a method for manufacturing graphene by using molecule beam epitaxy (MBE) at a low temperature, such that the characteristics of the obtained graphene and that of the existing graphene are identical in order to meet long-felt need in the industry.

SUMMARY OF THE INVENTION

A primary objective of the present invention is to provide a method for manufacturing a graphene under a low temperature. The carbon source is evaporated at a high temperature, and then forms molecule beams to deposit onto the substrate of molecule beam epitaxy system under a low temperature. After growth, the graphene formed on the substrate is transferred and reattached to another substrate, and then the product of the present invention is obtained.

To achieve the foregoing objective, the present invention provides a method for manufacturing a graphene film, comprising following steps: (a) annealing a first substrate in a furnace filled with a mixed gas; (b) moving the first substrate into a growing chamber of a molecular beam epitaxy system, wherein a temperature of the growing chamber is ranged from room temperature to 500° C.; (c) heating a carbon source set in the molecular beam epitaxy system to evaporate carbon atoms onto a surface of the first substrate; and (d) depositing carbon atoms on the surface of the first substrate to grow the graphene film.

In addition, the present invention also provides a method for manufacturing a graphene channel within a transistor, comprising following steps: (a) annealing a first substrate in a furnace filled with a mixed gas; (b) moving the first substrate into a growing chamber of a molecular beam epitaxy system, wherein a temperature of the growing chamber is ranged from room temperature to 500° C.; (c) heating a carbon source set in the molecular beam epitaxy system to evaporate carbon atoms onto a surface of the first substrate; (d) depositing carbon atoms on the surface of the first substrate to grow a graphene film; (e) replacing the first substrate with a second substrate; (f) etching the graphene film by a photolithography process.

In a preferred embodiment of the present invention, the mixed gas may be $H_2/Ar$.

In a preferred embodiment of the present invention, the first substrate may be a copper substrate.

In a preferred embodiment of the present invention, the carbon source may be heated to 2100-2200° C.

In a preferred embodiment of the present invention, the carbon source may be graphite; preferably may be a carbon filament.

Preferably, the step (e) may further comprises following steps: (e1) coating the graphene film on the side opposite to the first substrate with an organic polymer material, and heating the organic polymer material by a temperature of 150-200° C. to cure the organic polymer material; (e2) removing the first substrate by a reagent to obtain the graphene film coated with the organic polymer material; (e3) attaching the graphene film coated with the organic polymer material to the second substrate through a step of dredge up; (e4) removing the organic polymer material to obtain the graphene film attached to the second substrate.

In a preferred embodiment of the present invention, the organic polymer material may be poly(methyl methacrylate).

In a preferred embodiment of the present invention, the reagent may be a ferric chloride solution.

In a preferred embodiment of the present invention, the organic polymer material may be removed by acetone.

In a preferred embodiment of the present invention, the transistor may be a back-gate transistor.

In a preferred embodiment of the present invention, the second substrate may be a Si substrate having a silicon dioxide layer.

In a preferred embodiment of the present invention, the Si substrate may be a p-type Si substrate having a boron doping concentration of $1 \times 10^{15}$ cm$^{-3}$.

Preferably, after the step (e), the method for manufacturing a graphene channel within a transistor may further comprise a following step: (g) evaporating a metal to both terminals of the graphene film to form a source and a drain.

In a preferred embodiment of the present invention, the metal may be titanium or gold.

This summary is not an extensive overview of the disclosure and its sole purpose is to present some concepts disclosed herein in a simplified form as a prelude to the more detailed description that is presented later.

Many of the attendant features and advantages of the present invention will becomes better understood with reference to the following detailed description considered in connection with the accompanying drawings.

BRIEF DESCRIPTION OF THE DRAWINGS

The present description will be better understood from the following detailed description read in light of the accompanying drawings, where:

FIG. 1(c) is the Raman spectrum of the graphene film transferred from the Cu foil onto a 600 nm SiO$_2$/p-type Si substrate;

FIG. 4 represents illustrations of graphene growth in the MBE system under: (a) 300° C., 12 ns; (b) 300° C., 16 ns; (c) room temperature, 12 ns.

DESCRIPTION

Details of the objects, technical configuration, and effects of the present invention will be described more fully hereinafter with reference to the accompanying drawings, in which exemplary embodiments of the invention are shown. The like reference numerals indicate the like configuration throughout the specification, and in the drawings, the length and thickness of layers and regions may be exaggerated for clarity. The technical content of the present invention will become apparent by the detailed description of the following embodiments and the illustration of related drawings as follows. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments.

The singular forms "a", "and", and "the" are used herein to include plural referents unless the context clearly dictates otherwise.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

The term "graphene" refers to any structure having a carbon lattice matrix, and is theoretically a single pure layer or few layers of graphite. Also, graphene is a planar polycyclic single atomic layer of pure carbon in a honeycomb-like lattice of sp$^2$-hybridized carbon rings.

One objective of the present invention is to solve the problem that the conventional method of manufacturing a graphene can't work at a low temperature. The person having ordinary skills in the art knows that the common method for manufacturing the graphene is CVD method, but it must be done at a high temperature and is more suitable for large-area preparation scale. Furthermore, to satisfy the needs of semiconductor industry, especially for the needs for applications in a back-gate transistor, the present invention provides a method for manufacturing the graphene at a low temperature. This method employs the molecule beam epitaxy (MBE) system to evaporate the carbon source forming a molecule beam at a high temperature, and then deposit the molecule beam on the substrate of MBE system under a low temperature. After growth, the graphene transferring and reattachment are conducted to prepare the products that meet industrial needs.

To achieve the desired needs, the present invention offers a method for manufacturing a graphene film, comprising following steps: (a) annealing a first substrate in a furnace filled with a mixed gas; (b) moving the first substrate into a growing chamber of a molecular beam epitaxy system, wherein a temperature of the growing chamber is ranged from room temperature to 500° C., preferably at 300° C.; (c) heating a carbon source set in the molecular beam epitaxy system to evaporate carbon atoms onto a surface of the first substrate; and (d) depositing carbon atoms on the surface of the first substrate to grow the graphene film.

In addition, to achieve another objective, the present invention provides another method for manufacturing a graphene channel within a transistor, comprising following steps: (a) annealing a first substrate in a furnace filled with a mixed gas; (b) moving the first substrate into a growing chamber of a molecular beam epitaxy system, wherein a temperature of the growing chamber is ranged from room temperature to 500° C., preferably at 300° C.; (c) heating a carbon source set in the molecular beam epitaxy system to evaporate carbon atoms on a surface of the first substrate; (d) depositing the carbon atoms onto the surface of the first substrate to grow a graphene film; (e) replacing the first substrate with a second substrate; (f) etching the graphene film by a photolithography process.

Wherein, said step (e) may further comprises following steps: (e1) coating the graphene film on the side opposite to the first substrate with an organic polymer material, and heating the organic polymer material by a temperature of 150-200° C. to cure the organic polymer material, preferably 180° C.; (e2) removing the first substrate by a reagent to obtain the graphene film coated with the organic polymer material; (e3) attaching the graphene film coated with the organic polymer material to the second substrate through a step of dredge up; (e4) removing the organic polymer material to obtain the graphene film attached to the second substrate.

In addition, after the step (e), the method for manufacturing a graphene channel within a transistor may further comprise a following step: (g) evaporating a metal to both terminals of the graphene film to form a source and a drain.

The following descriptions are provided to elucidate certain aspects of the present invention and to aid those of skilled in the art in practicing this invention. These Examples are merely exemplary embodiments and in no way to be considered to limit the scope of the invention in any manner.

Example 1

Preparation of Graphene Film

A 100 μm thick Cu foil was annealed in a furnace for crystallization. The furnace was filled with $H_2$/Ar mixture gas with a fixed chamber pressure of 7 torr. The annealing temperature was 1000° C. and the annealing time was 10 minutes. The flow rate of $H_2$ and Ar were 150 and 500 sccm, respectively. The grained Cu foil was then transferred to a homemade MBE system at 300° C. to deposit carbon atoms by using Ribar carbon filament effusion cell. The cell temperature was set at 2173° C., which corresponds to a carbon flux of around $5.3 \times 10^{11}$/cm$^2$·sec and a deposition rate of around 0.2 nm/min. The carbon flux can be precisely controlled by adjusting the temperature of effusion cell installed in the MBE system, thereby controlling the deposition rate of carbon on the Cu foil.

After 30 minutes at 300° C., a graphene film was grown on the Cu foil, the sample was cooled to room temperature and then transferred out from the growth chamber. To transfer the graphene film out from the Cu foil, a layer of polymethylmethacrylate (PMMA) was firstly spin coated on the sample and baking at 180° C. for 2 minutes. And then the Cu foil was removed with ferric chloride solution. After reattachment the graphene film to a p-type Si substrate having 600 nm-thick $SiO_2$ on the surface and a boron doping concentration of $1 \times 10^{15}$ cm$^{-3}$ through a step of dredge up, and the PMMA layer was removed by using acetone. And then the graphene film attached to the p-type Si substrate was obtained.

Example 2

Analysis of Graphene Film

The scanning tunneling microscope (STM) images of the graphene film in the present invention were taken by using RHK-SPM 100 system under ambient circumstance. The Raman measurements were performed by using HORIBA Jobin Yvon HR800UV spectrum system on the films transferred to the $SiO_2$/Si substrates.

Figure 1A:
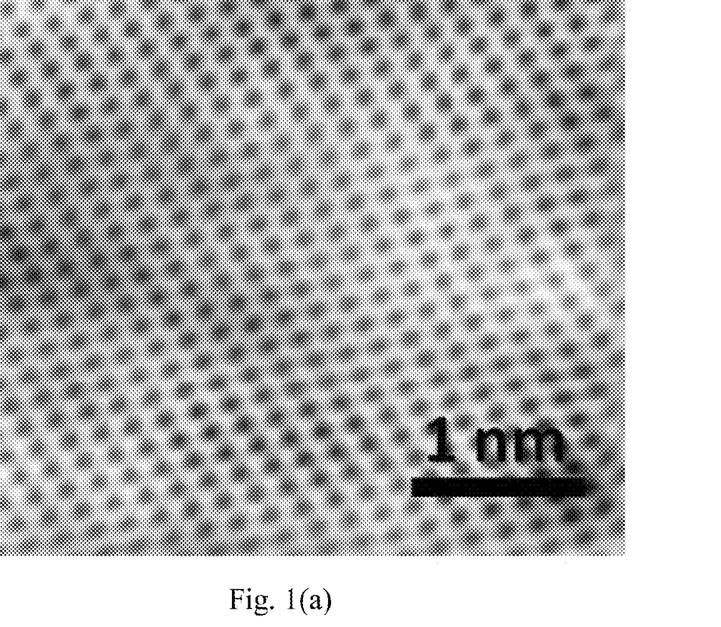
FIG. 1(a) is an analysis diagram for hexagonal structure of carbon atoms.
Figure 1B:
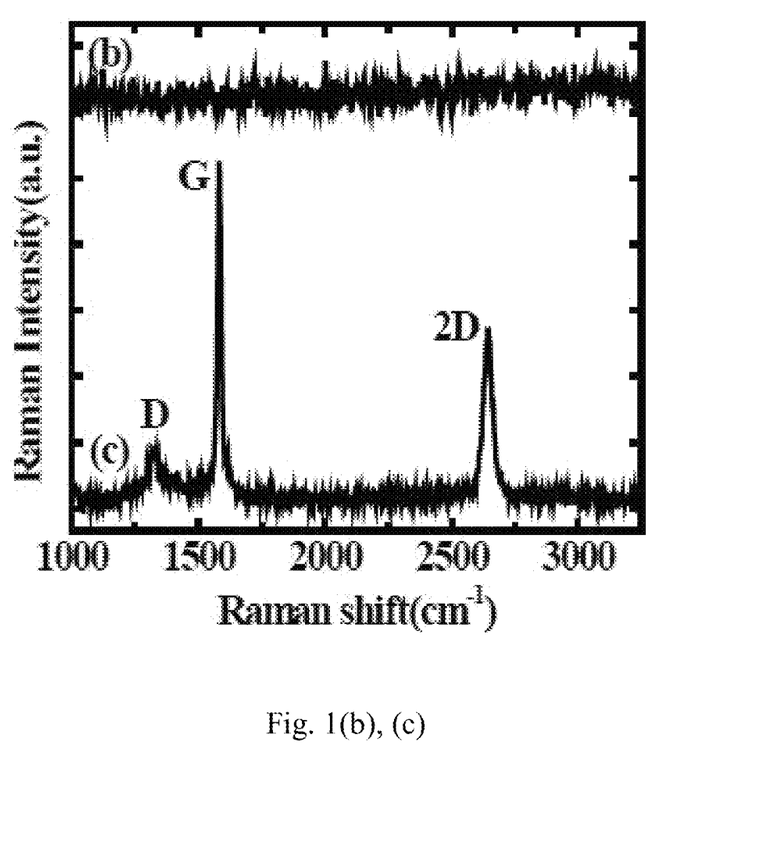
FIG. 1(b) is the Raman spectrum of the Cu foil measured after high-temperature furnace annealing.

The 4.2×4.2 nm$^2$ STM image of the graphene film grown on a Cu foil at 300° C. measured under a tunneling current of 1.05 nA and a bias of 1.6 V was shown in FIG. 1(a). As shown in the figure, completely hexagonal structure of carbon atoms can be observed. These results suggested that by using the atomic carbon source, graphitization could take place at a low temperature of 300° C. To verify if the graphene film was formed after high-temperature furnace annealing step or after MBE growth step, the Raman spectrum of the Cu foil measured after high-temperature furnace annealing was shown in FIG. 1(b). No characteristic peaks for graphene were observed in the Raman spectrum, which suggested that there was no graphene film formed after high-temperature furnace annealing. On the contrary, after transferring the graphene film from the Cu foil to the 600 nm $SiO_2$/p-type Si substrate, Raman measurements were performed on the graphene film, which was shown in FIG. 1(c). Low D peak of the transferred graphene film suggested that relatively few defects were observed on the graphene film even with the low growth temperature of 300° C. And from the ratio of 2D and G peak, it was estimated that there were about 5-6 graphene layers in the graphene film, which was different from the CVD-prepared graphene film grown on a Cu foil by a self-limited process. Due to the low solubility of carbon atoms in Cu foils, the growth mechanisms of CVD-prepared graphene films on the Cu foil were hydrocarbon gas decomposition and subsequent carbon atom adsorption onto the substrate (Cu foil) surface. After the formation of the first layer of graphene film on the Cu surface, carbon atom adsorption would not take place on the graphene surface. This is because such dehydrogenation reactions require Cu as a surface catalytic material, and it results in self-limiting. For the MBE-grown graphene, on the other hand, elemental carbon atoms were directly deposited onto the substrate via the Van der Waals interaction at a low temperature (300° C.); hence, the layer number of the graphene films was determined by the amount of supplied carbon atoms. In this case, a multi-layer graphene film was observed by using MBE growth technique.

Example 3

Analysis of Graphene Film Fabricated into Back-Gate Transistor

Figure 2A:
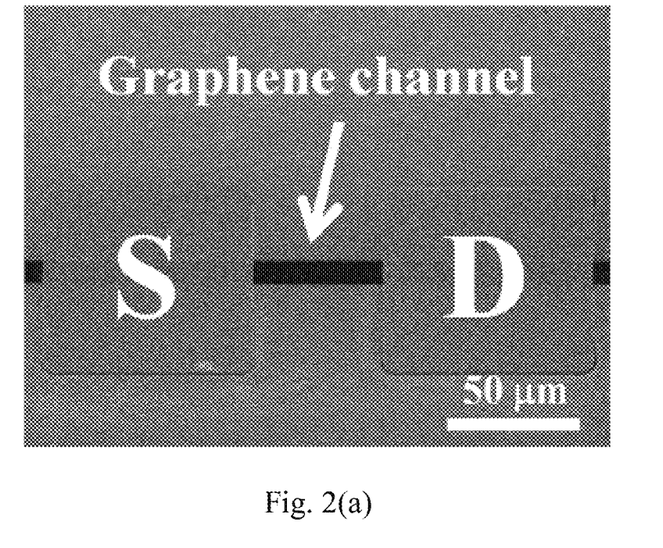
FIG. 2(a) illustrates a scanning electron microscope (SEM) image analysis diagram of the back-gate transistor having the graphene film of the present invention.
Figure 2B:
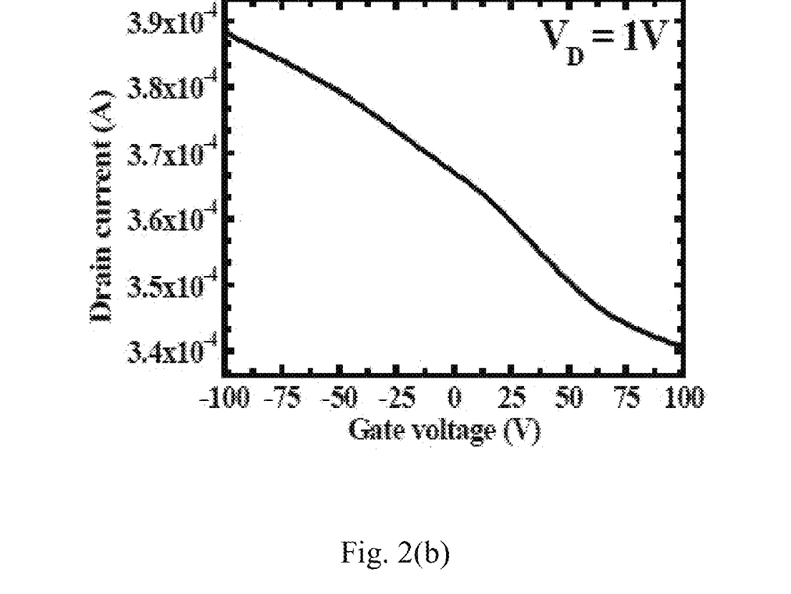
FIG. 2(b) illustrates drain currents of the graphene film within back-gate transistor measured under different gate biases.

The graphene film transferred onto the 600 nm $SiO_2$/p-type Si substrate was fabricated into a back-gate transistor. As shown in FIG. 2(a), this is an image analysis diagram of the transistor device analyzed by the scanning electron microscope (SEM). The graphene stripes were defined by using the standard photolithography procedure with $O_2$ plasma etching. After Au metal evaporation for source/drain terminals, a graphene transistor having a channel with 10 μm channel width and 50 μm channel length was fabricated. In addition, the drain currents of the back-gate transistor measured under different gate biases were shown in FIG. 2(b). As shown in the figure, a significant current modulation was observed for the device. By fitting the curve using the equation $\mu = (dI_D/dV_g)/(\in V_D W/T_{ox} L)$, where $T_{ox}$, W and L represent the gate dielectric thickness, channel width and channel length, respectively. $\in$ is a dielectric constant of dielectric layer, and $V_D$ is a source-drain bias. The mobility of this device was obtained as 123.1 cm$^2$/(V·s), which was compatible with the conventional CVD-prepared graphene films. The results have demonstrated that the growth temperature of graphene films can be significantly reduced to 300° C. by using MBE system. The unique material characteristics of graphene can still be maintained at such a low growth temperature. Obviously, the applications of the graphene film in the semiconductor fabrication lines will have boundless prospects.

Comparative Example 1

Analysis of Graphene Film Prepared at Room Temperature

Figure 3:
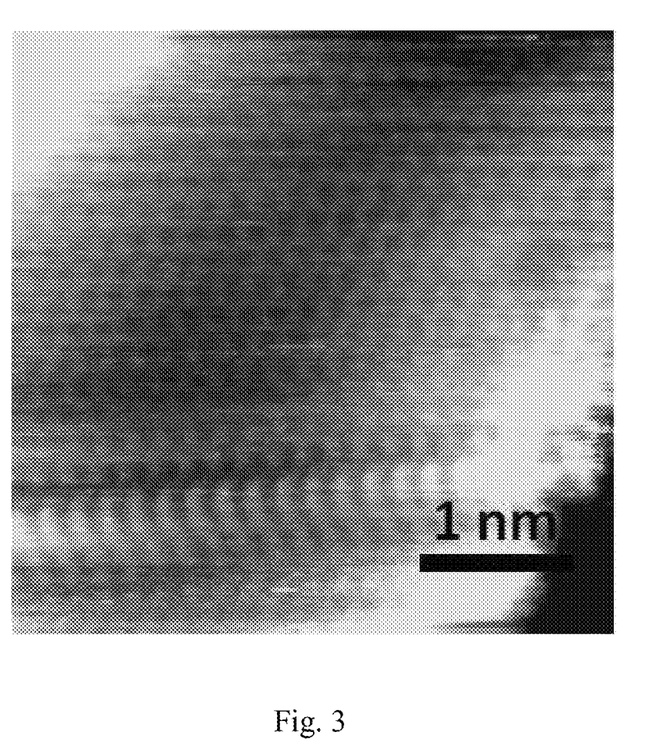
FIG. 3 illustrates the STM image of the graphene flake grown at room temperature.

Although 300° C. was already an acceptable temperature for semiconductor fabrication lines, further studies were carried out to see if graphitization would take place at an even lower temperature. Hence, following a similar growth procedure, the grained Cu foil obtained from the same high-temperature annealing step was transferred into the MBE chamber for 30-minute carbon deposition and growth except the growth temperature was at room temperature (i.e. 300K). The STM image over the sample revealed that there were graphene flakes covered the whole surface of the Cu foil, as shown in FIG. 3, which was similar with the image shown in FIG. 1 (a). In other words, hexagonal structure of carbon atoms was also observed for the sample grown at room temperature. However, the arrangement order of carbon atoms at room temperature was worse than that at 300° C., this is because the carbon atoms still need an appropriate internal energy for a nucleation reaction and an expanding reaction when the carbon atoms deposit onto the Cu foil, such that the carbon atoms orderly deposit onto the Cu foil via the Van der Waals interaction. Compared with the graphene film grown at 300° C., the results suggested that although graphitization would take place at room temperature, a higher substrate temperature may still be required for the carbon atom migration on the Cu foil surface to form a more uniform and complete graphene film.

Comparative Example 2

Molecule Dynamics Simulation at Different Temperature System

Figure 4A:
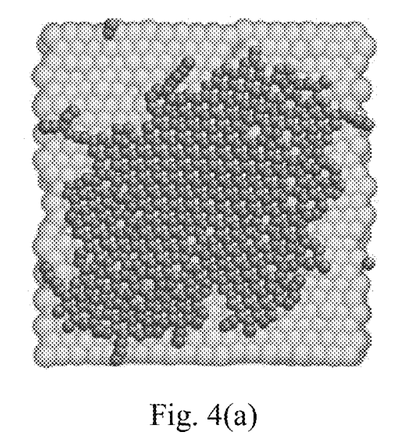
Figure 4B:
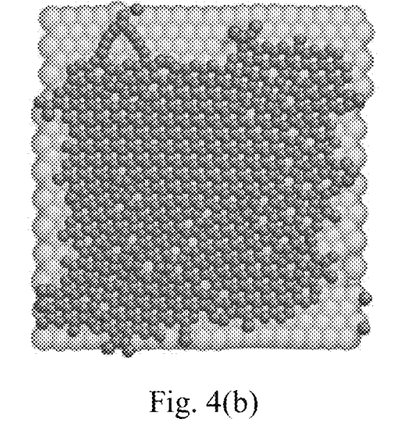
Figure 4C:
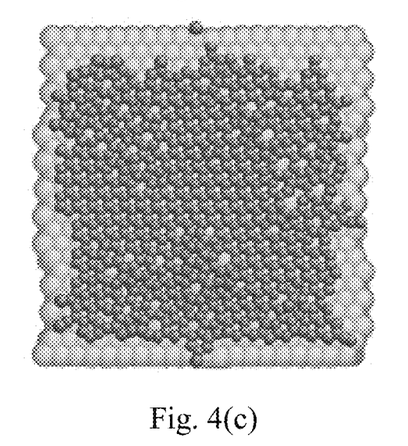

MD (molecular dynamics) simulations were also carried out to simulate the deposition and growth of graphene on the Cu foil in the MBE system at two temperatures: 300° C. (i.e. 573 K), and room temperature (i.e. 300 K). In those MD simulations, one carbon adatom was deposited onto Cu (111) surface every 2 ps. The initial temperature of carbon adatoms was set to 2000 K and these carbon adatoms would gradually dissipate their thermal energies on Cu surface. The present invention employed the AIREBO potential to describe the interaction between carbon atoms, and the LAMMPS MD simulation software package to perform MD simulations. During those deposition simulations, some carbon adatoms desorbed and these carbon atoms were removed from this system. FIG. 4 displayed the snapshot of MBE-grown graphene films at 300° C. (FIGS. 4(a) and (b)) and at room temperature (FIG. 4(c)). From FIG. 4, the formation of graphene film on Cu surface could be clearly seen. Comparing FIGS. 4 (a) and 4 (c), the results suggested that more carbon adatoms desorbed in the 300° C. MD simulation because the graphene film grown under 300° C. had less graphene coverage comparing with that grown under room temperature (300 K). Close examinations of the graphene films having similar surface coverage (i.e. FIGS. 4 (b) and 4 (c)) indicated that graphene film grown at a higher temperature (i.e. 300° C.) had less defects comparing with that grown at room temperature. Therefore, the MD simulations performed in the present invention confirm the possibility of graphene growth at a low temperature (including room temperature and 300° C.).

In accordance with the present invention, the method for manufacturing a graphene film has the following advantages:
(1) The graphene products with nice characteristics can be manufactured at a lower temperature (300° C.).
(2) The graphene film can be transferred onto a SiO$_2$/Si substrate, and applied in the semiconductor industry.
(3) The present invention can precisely control carbon flux and deposition rate by controlling effusion cell temperature, thereby manufacturing the desired graphene film.

It will be understood that the above description of embodiments is given by way of example only and that various modifications may be made by those with ordinary skill in the art. The above specification, examples, and data provide a complete description of the present invention and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention.

What is claimed is:
1. A method for manufacturing a graphene film, comprising following steps:
(a) annealing a first substrate in a furnace filled with a mixed gas;
(b) moving the first substrate into a growing chamber of a molecular beam epitaxy system, wherein a temperature of the growing chamber is ranged from room temperature to 500° C.;
(c) heating a carbon source set in the molecular beam epitaxy system to evaporate carbon atoms onto a surface of the first substrate; and
(d) depositing the carbon atoms on the surface of the first substrate to grow the graphene film.
2. A method for manufacturing a graphene channel within a transistor, comprising following steps:
(a) annealing a first substrate in a furnace filled with a mixed gas;
(b) moving the first substrate into a growing chamber of a molecular beam epitaxy system, wherein a temperature of the growing chamber is ranged from room temperature to 500° C.;
(c) heating a carbon source set in the molecular beam epitaxy system to evaporate carbon atoms onto a surface of the first substrate;
(d) depositing the carbon atoms on the surface of the first substrate to grow a graphene film;
(e) replacing the first substrate with a second substrate; and
(f) etching the graphene film by a photolithography process.
3. The method of claim 1, wherein the mixed gas is H$_2$/Ar.
4. The method of claim 1, wherein the first substrate is a copper substrate.
5. The method of claim 1, wherein the carbon source is heated to 2100-2200° C.
6. The method of claim 1, wherein the carbon source is graphite.
7. The method of claim 2, wherein the step (e) comprises following steps:
(e1) coating the graphene film on the side opposite to the first substrate with an organic polymer material, and heating the organic polymer material by a temperature of 150-200° C. to cure the organic polymer material;

(e2) removing the first substrate by a reagent to obtain the graphene film coated with the organic polymer material;

(e3) attaching the graphene film coated with the organic polymer material to the second substrate through a step of dredge up;

(e4) removing the organic polymer material to obtain the graphene film attached to the second substrate.

8. The method of claim 7, wherein the organic polymer material is poly(methyl methacrylate).

9. The method of claim 7, wherein the reagent is a ferric chloride solution.

10. The method of claim 7, wherein the organic polymer material is removed by acetone.

11. The method of claim 2, wherein the transistor is a back-gate transistor.

12. The method of claim 11, wherein the second substrate is a Si substrate having a silicon dioxide layer.

13. The method of claim 12, wherein the Si substrate is a p-type Si substrate having a boron doping concentration of $1 \times 10^{15}$ cm$^{-3}$.

14. The method of claim 2, further comprising a following step:

(g) evaporating a metal to opposite ends of the graphene film to form a source and a drain.

15. The method of claim 14, wherein the metal is titanium or gold.

16. The method of claim 2, wherein the mixed gas is $H_2$/Ar.

17. The method of claim 2, wherein the first substrate is a copper substrate.

18. The method of claim 2, wherein the carbon source is heated to 2100-2200° C.

19. The method of claim 2, wherein the carbon source is graphite.

* * * * *